United States Patent [19]

Gyorgy et al.

[11] Patent Number: 5,272,132
[45] Date of Patent: Dec. 21, 1993

[54] APPARATUS COMPRISING A CERAMIC SUPERCONDUCTIVE BODY AND METHOD FOR PRODUCING SUCH A BODY

[75] Inventors: Ernst M. Gyorgy, Madison; David W. Johnson, Jr., Pluckemin, both of N.J.

[73] Assignee: AT&T Bell Laboratories, Murray Hill, N.J.

[21] Appl. No.: 794,301

[22] Filed: Nov. 14, 1991

Related U.S. Application Data

[63] Continuation of Ser. No. 368,079, May 22, 1989, abandoned, which is a continuation of Ser. No. 36,168, Apr. 6, 1987, abandoned, which is a continuation-in-part of Ser. No. 25,913, Mar. 16, 1987, abandoned.

[51] Int. Cl.$^5$ .................... H01B 12/06; H01L 39/12; H01L 39/02
[52] U.S. Cl. .......................... 505/1; 264/61; 264/63; 427/62; 427/356; 505/741
[58] Field of Search .............. 505/1, 241, 280, 779, 505/778; 29/599; 427/62, 356; 174/126 S; 264/61, 63

[56] References Cited

U.S. PATENT DOCUMENTS

| | | | |
|---|---|---|---|
| 3,897,257 | 7/1975 | Gupta | 501/152 |
| 4,054,532 | 10/1977 | Hanke et al. | 501/152 |
| 4,070,529 | 1/1978 | Delmas et al. | 501/152 |
| 4,211,758 | 7/1980 | Buhrer | 501/152 |
| 4,266,978 | 5/1981 | Prochazka | 501/152 |
| 4,357,426 | 11/1982 | Murata et al. | 501/152 |
| 5,045,526 | 9/1991 | Nagesh et al. | 505/1 |
| 5,089,465 | 2/1992 | Sibata et al. | 505/741 |

OTHER PUBLICATIONS

Evidence of Superconductivity above 40K in the La–Ba–Cu–O Compound System: Phy Rev Lett., vol. 58, #4, pp. 405–407, 26 Jan. 1987.
Pages 1–8 of 07/034867 showing part of Negesh et al. Used in Rejection was in 034867.
*Ceramic Fabrication Processes*, W. D. Kingery, editor, MIT and John Wiley & Sons, 1958, "Slip Casting Nonclay Ceramics" by P. D. S. St. Pierre, pp. 45–51.
*Ceramic Fabrication Processes*, W. D. Kingery, Editor, MIT and John Wiley & Sons, 1958, "Vertical Extrusion of Nonclay Compositions" by C. Hyde, pp. 107–111.
*Superconductor Applications: SQUIDS and Machines*, editors B. B. Schwartz et al, Plenum Press, New York, pp. 674 no date available.
*Hybrid Circuit Technology*, Feb. 1987 "Defining Precision Screen Printers" by J. Medernach, pp. 21–24.
*Ceramic Bulletin*, vol. 63, No. 4 (1984) "Microelectronics Packaging: II" by B. Schwartz, pp. 577–580.
*Treatise on Materials Science and Technology*, vol. 9, Ceramic Fabrication Processes, F. F. Y. Wang, editor, Academic Press (1979) pp. 173–198.
"Bulk Superconductivity at 36K in $La_{1.8}Sr_{0.2}CuO_4$", R. J. Cava et al., *Physical Review Letters*, vol. 58, No. 4, 26 Jan. 1987, pp. 408–410.
*Physical Review Letters*, vol. 58, No. 9, 2 Mar. 1987 "Superconductivity at 93K in a New Mixed-Phase Y–Ba–Cu–O Compound System at Ambient Pressure" pp. 908–910 by M. K. Wu et al.
*Zeitscher f. Physik B–Condensed Matter*, vol. 64 (1986) "Possible High $T_c$ Superconductivity in the Ba–La–Cu–O–System" by J. G. Bednorz et al, pp. 189–193.

(List continued on next page.)

*Primary Examiner*—Mark L. Bell
*Assistant Examiner*—C. M. Bonner
*Attorney, Agent, or Firm*—Eugen E. Pacher

[57] ABSTRACT

Filamentary and sheet-like oxide superconductive bodies can be produced by ceramic fabrication techniques such as extrusion, screen printing, tape casting and slip casting, provided the firing conditions are chosen such that the correct amount of oxygen deficiency is attained in the ceramic, and such that contact with chemically non-compatible material is avoided. Thus produced superconductive bodies are advantageously incorporated into apparatus such as magnets, power cables, interconnects, electrical components, and sensors.

8 Claims, 4 Drawing Sheets

OTHER PUBLICATIONS

*Physical* 126B (1984) "Superconductivity in Ba(PbBi)O$_3$" by B. Batlogg, pp. 275-279.

*Superconducting Machines and Devices, Large Systems Applications*, editors S. Foner et al, Plenum Press, New York (Title page), no date available.

*Superconductor Materials Science, Metallurgy, Fabrication and Applications*, editors S. Foner et al, Plenum Press, New York (Title Page), no date available.

*Physical Review Letters*, vol. 58, No. 9, 2 Mar. 1987 "High-Pressure Study of the New York-Ba-Cu-O Superconducting Compound System" by P. H. Hor et al, pp. 911-912.

*New York Times*, Saturday, Mar. 28, 1987, p. 6 "New Gain on Conducting Electricity".

"Observation of the Inverse ac Josephson Effect at 240K" by J. T. Chen et al (9 pages)—To be published, no date available.

APPARATUS COMPRISING A CERAMIC SUPERCONDUCTIVE BODY AND METHOD FOR PRODUCING SUCH A BODY

This application is a continuation of application Ser. No. 07/368,079, filed on May 22, 1989, now abandoned, which was a continuation of application Ser. No. 07/036,168 filed Apr. 6, 1987, now abandoned, which was a continuation-in-part of application Ser. No. 07/025,913 filed Mar. 16, 1987, now abandoned.

TECHNICAL FIELD

This invention pertains to producing superconductive bodies, and apparatus and systems comprising such bodies.

BACKGROUND OF THE INVENTION

From the discovery of superconductivity in 1911 to the recent past, essentially all known superconducting materials were elemental metals (e.g., Hg, the first known superconductor) or metal alloys (e.g., $Nb_3Ge$, probably the material with the highest transition temperature $T_c$ known prior to 1986).

Recently, superconductivity was discovered in a new class of materials. See, for instance B. Batlogg, *Physica* 126,275 (1984), which review superconductivity in barium bismuth lead oxide, and J. G. Bednorz and K. A. Muller *Zeitschr f. Physik B—Condensed Matter*, Vol. 64, 189 (1986), which reports superconductivity in lanthanum barium copper oxide. The latter disclosed material had an onset temperature in the 30 K. range.

Especially the latter report stimulated worldwide research activity, which very quickly resulted in further significant progress. The progress has resulted, inter alia, to date in the discovery that compositions in the Y-Ba-Cu-O system can have superconductive transition temperatures above 77 K., the boiling temperature of liquid $N_2$ (*Phys. Rev. Letters*, Vol. 58, Mar. 2, 1987, p. 908; and ibid, p. 911). Furthermore, it has resulted in the identification of the material phase that is responsible for the observed high temperature superconductivity, and in the discovery of compositions and processing techniques that result in the formation of bulk samples of material that can be substantially single phase material and can have $T_c$ above 90 K. (see the U.S. patent application Ser. No. 024,046 entitled "Devices and Systems Based on Novel Superconducting Material," filed by B. J. Batlogg, R. J. Cava and R. B. van Dover on Mar. 9, 1987, co-assigned with this and incorporated herein by reference, which is a continuation-in-part of an application filed by the same applicants on Mar. 3, 1987, which in turn is a continuation-in-part of application Ser. No. 001,682, filed by the same applicants on Jan. 9, 1987).

As discussed in detail in the above referred to U.S. patent application, prior to the discovery, at AT&T Bell Laboratories, of the nature of the superconducting phase and of compositions and processing conditions that can result in substantially single phase oxide superconducting material, the expressed belief in the field was that the Y-Ba-Cu-O superconducting material is multiphase material, with only a relatively small part (variously considered to be about 24% or about 2%) being superconducting. Significantly, it was also speculated that the high temperature superconductivity of the material may be associated with interfacial manifestations, and may not be identified with perovskite or tetragonal layered structures.

The excitement in the scientific and technical community that was created by the recent advances in superconductivity is at least in part due to the potentially immense technological impact of the availability of materials that are superconducting at temperatures that do not require refrigeration with expensive liquid He. For obvious reasons liquid hydrogen and neon would not be very desirable refrigerants, and therefore it is liquid nitrogen (B. P. 77 K.) that is considered to be the lowest boiling point convenient and inexpensive cryogenic refrigerant. Attainment of superconductivity at liquid nitrogen temperature was thus a long-sought goal which for a long time appeared almost unreachable.

Although the "holy grail" of superconductivity, $T_c > 77$ K. has now been attained, there still exists at least one barrier that has to be overcome before the new oxidic high $T_c$ superconductive materials can be utilized in many technological applications. In particular, techniques for forming superconductive bodies of technologically significant shape have to be developed.

To date known oxidic superconductive bodies are substantially three-dimensional bodies (e.g., pellets, disks, tori), i.e., all three dimensions are of substantially the same order of magnitude. Although such three-dimensional bodies may have specialized utility widespread use of the new high $T_c$ materials will occur only if superconductive thin films, and sheet-like and filamentary superconductive bodies can be produced from the material.

According to a so-far unconfirmed report in the press, one laboratory has succeeded in producing a superconductive thin film from one of the oxidic high $T_c$ materials by an evaporation technique. Evaporation as well as other thin film deposition techniques generally can be used to deposit layers of limited thickness (typically $<5$ $\mu$m) onto a substrate.

No technique for producing superconductive bodies having a small dimension greater than is obtainable by thin film techniques but less than is found in the prior art three-dimensional bodies has yet been reported. Such bodies, which can be free-standing or can be in contact with a substrate, typically have a minimum dimension in the range from 5 or 10 $\mu$m to about 1 mm, and have at least one dimension which is much greater than the minimum dimension. If a body has two dimensions that are approximately equal and in the above range then we will refer to such a body as "filamentary". An example of a filamentary body is a thin rod. If a body has, in addition to the one small dimension, two large dimensions of approximately equal magnitude, or one large dimension and one intermediate dimension then we will refer to the body as "sheet-like". Examples of sheet-like bodies are sheets, wide strips, shaped portions of a sheet, and strips or lines in which both the thickness and the width are within the above range.

If filamentary and/or sheet-like superconducting bodies could be produced from the new high $T_c$ oxidic materials it is certain that they would find significant technological application. It will be recalled that prior art superconductors are used, in addition to thin film form, essentially only in filamentary form (as wire), and in strip-form. Furthermore, because of the novel properties of the oxidic superconductors, it is likely that filamentary and sheet-like superconductive bodies would find uses in ways that were not possible or practical with the prior art metallic superconductors.

Thought is given here, for instance, to assemblies of sheet-like superconductive elements.

For one overview of some potential applications of superconductors see, for instance, B. B. Schwartz and S. Foner, editors, *Superconductor Applications: SQUIDS and Machines*, Plenum Press 1977; S. Foner and B. B. Schwartz, editors, *Superconducting Machines and Devices*, Plenum Press 1974; and S. Foner and B. B. Schwartz, *Superconductor Material Science, Metallurgy, Fabrication, and Applications*, Plenum Press 1981. Among the applications are detection and measurement apparatus based on, e.g., the Josephson effect or electron tunneling, power transmission lines, rotating machinery, and superconductive magnets for, e.g., fusion generators, MHD generators, particle accelerators, levitated vehicles, magnetic separation, and energy storage. The prior art has considered these actual and potential applications in terms of the prior art (non-oxidic) superconductors. It is expected that the above and other applications of superconductivity would materially benefit if high $T_c$ superconductors could be used instead of the previously considered relatively low $T_c$ superconductors.

In the previously referred to co-assigned U.S. patent application Ser. No. 024,046 it is disclosed that the "calcined oxidic powder is "formed into a ceramic body of desired shape by standard ceramic processing techniques such as hot or cold pressing, extension, slip casting, or other such technique appropriate to the geometry of the desired (green body) object."

Prior art ceramic techniques can indeed successfully produce three-dimensional superconducting bodies. However, workers in this field have so far failed to produce superconducting filamentary or sheet-like bodies by any technique, including ceramic techniques.

A known technique, screen printing, has been used in the past to form sheet-like bodies on ceramic substrates. See, for instance, B. Schwartz, *Ceramic Bulletin* Vol. 63(4), p. 577(1984). The bodies included conductors (including conductors that comprise the conducting oxide $RuO_2$), insulators and dielectrics. The technique was not used to form any superconductive bodies.

In view of the immense potential importance of high $T_c$ superconductive bodies of technologically useful (i.e., having at least one small dimension and at least one relatively large dimension) shape, a technique for producing such bodies would be of great significance. This application discloses such a technique.

SUMMARY OF THE INVENTION

In a broad sense the invention is apparatus that comprises a filamentary and/or sheet-like superconductive body formed by a technique that comprises forming an oxide powder-containing "green" body and heating the green body under conditions such that the resulting ceramic body is a superconductor. Significant consideration is to be given to the chemical compatibility of the firing apparatus (especially the substrate that supports the body) with the material of the body, and to those other firing conditions that can have an effect on the composition (especially the degree of oxygen deficiency) of the resulting body.

Bodies according to the invention will frequently comprise copper-containing mixed oxides, including oxides of the type $La_{2-x}M_xCuO_{4-\delta}$ (M being one or more of Ba, Sr, Ca, ..., $x \geq 0.05$, and $0 \leq \delta \leq 0.5$), or of the type $M_2M'Cu_3O_{9-\delta}$ (M is one or more essentially divalent metal ion, M' is one or more essentially trivalent metal ion, $\delta \geq 1$, and divergence from the nominal amounts of M and M40 is a maximum of 10%; frequently M comprises one or more of Ba, Ca, and Sr, and M' frequently comprises one or more of Y, La, Eu, Lu, and Sc). The bodies typically have a relatively high superconducting temperature $T_c$, generally >30 K. Preferred embodiments are substantially single phase material (typically >75 or even 95% by volume superconducting material).

Preferred embodiments become superconductive at a temperature $T_c > 77$ K. An example of a material with $T_c > 77$ K. is $Ba_2YCu_3O_{6.9}$. There have recently been claims that indications of superconductivity have been observed above 200 K., at temperatures as high as 240 K., in some oxides (cuprates) of the type that is of concern herein. See, for instance, *New York Times*, Saturday, Mar. 28, 1987, page 6, which reports on observations made at Wayne State University. See also J. T. Chen et al, "Observation of the Inverse ac Josephson Effect at 240 K.", to be published. Similar claims have also been made by workers at Berkeley University. The inventive method for making filamentary and sheet-like oxide superconductive bodies is broadly applicable to forming such bodies from oxide powder and is, in particular applicable to forming such bodies from cuprate powders such as the (La, Y) cuprate on which the Wayne State and Berkeley experiments were done. We will refer to cuprate bodies having substantially the composition used by these workers as being of the "Wayne State University type".

Among the techniques for producing the green bodies are extrusion, screen printing, tape casting, and slip casting. The inventive filamentary and sheet-like ceramic superconductive bodies can be advantageously used in a variety of apparatus including power transmission lines, rotating machinery such as electrical generators, magnets such as may be used in fusion generators, MHD generators, particle accelerators, levitating vehicles, and ion separation, or in ultra high-field magnets such as Bitter magnets. Inventive bodies can also be used as strip lines or other interconnects, or can be directly used as circuit components (e.g., a high-Q inductor). They may also find use as detectors and measurement devices.

DETAILED DESCRIPTION

Figure 1:
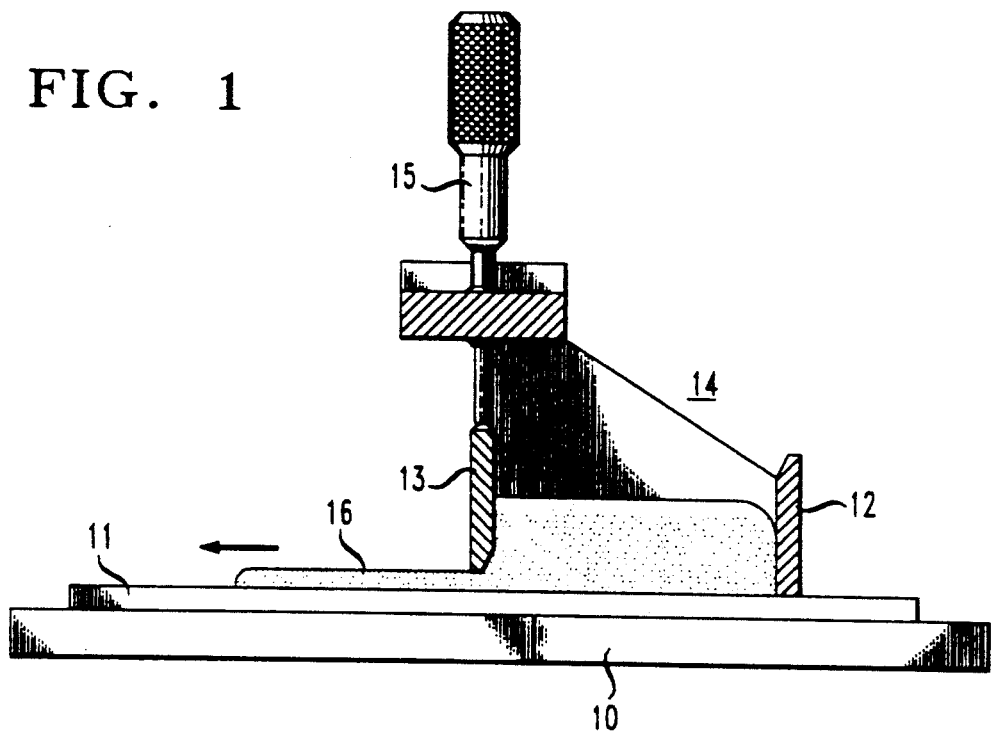
FIG. 1 schematically illustrates one technique for forming a green body according to the invention, the doctor blade technique.

Although in many currently preferred embodiments the inventive superconductive bodies consist substantially of perovskite, or a mixture of perovskites, of the type disclosed in the above referred to co-assigned U.S. patent application, the invention is not so limited. We believe that the techniques disclosed herein can, either directly or with obvious changes, be used in general in the manufacture of filamentary and/or sheet-like ceramic oxidic superconductive bodies having at least one relatively small dimension, generally in the approximate range 5 or 10 μm to 1 mm.

Such bodies not only are of substantial technological significance but their manufacture encounters a problem that is not present, or not of comparable severity, in the manufacture of bodies that do not have such a "small" dimension. The problem is the unpredictable outcome of the firing process with regard to superconductivity, including the amount of superconductive material present in the first body.

For instance, the processing conditions can result in a substantial change in the oxygen content of all or a significant portion of the total volume of the body, such that the affected portion of the body is semiconductive. As a further example, during processing the body might be in contact with an inappropriate substrate material, such that one or more atomic species diffuse into the body from the substrate, resulting in the absence of high $T_c$ superconductivity in all or a substantial portion of the body.

Preferred Materials

Among the currently preferred inventive bodies are substantially single phase perovskites of nominal composition $M_{3-m}M'_mCu_3O_{9-\delta}$, with m being preferably about 1. By "single phase" we mean that preferably at least about 95 mol percent of the material of body is a single phase, as determined by powder X-ray diffraction. While such "truly" single phase material is to be preferred and will most likely be the ambition for practical usage, under some circumstances it may be acceptable (or even desirable) for greater amounts of second phase material to be present, provided the body is a superconductor.

By "perovskite" is meant not only the prototype $ABO_3$ cubic structure, but very significantly also material whose lattice shows distortion (e.g., orthorhombic) from the cubic symmetry. As indicated in the above generic chemical formula, the preferred materials also depart from the nominal perovskite also in terms of stoichiometry. Analyzed materials had δ values of 1.9 to 2.5, but a somewhat greater δ range is expected to be compatible with superconductivity.

There are typically two significant compositional contributions to the structure of these preferred materials. These relate (a) to observed oxygen deficiency which reduces the coordination number of a portion of the copper from six to five or possibly four, and (b) mixed occupancy of the "A site" (in the prototypical representation $ABO_3$), i.e., occupancy by ions represented as M and M' in the general formula above—gives rise to a further variation. X-ray diffraction studies, in indicating single phase material, translate into substantial ordering of M and M' ions in selected compositions which, in turn, gives rise to a unit cell size larger than that of the primitive cell corresponding with the single formula unit $ABO_3$. X-ray diffraction measurements of a preferred composition—nominal $Ba_2YCu_3O_{6.9}$ indicate a crystallographic unit cell of orthorhomic symmetry of size a=3.87, b=3.86, c=11.67 Angstroms. This crystallographic cell is a "supercell" of the cubic $ABO_3$ and is of three times the volume due to subtle ordering effects. Other compositions may show different "supercells" or exhibit "supercells" whose diffraction signatures are too weak to be observed by conventional x-ray powder diffraction techniques. Such supercells are well known in perovskite structure type materials. In compositions herein in which M and M' ions differ in size sufficiently (e.g., in terms of an ionic radius ratio of at least 1.2), these materials are truly ordered for compositions in which inclusion of M/M' ions nominally follows the ratio 2/1, the repeating unit includes three primitive cells. While preferred compositions generally meet the ion size requirements for ordering, other superconducting compositions do not. Considerations such as material cost and ease of processing may lead to selection of such compositions which, in these terms, may be "disordered".

In terms of critical temperature, $T_c$, preferred compositions are those in which M is primarily barium. Partial substitution of barium by other ions, e.g., calcium and-/or strontium, may be dictated by economic or processing considerations. In preferred materials M' may be primarily yttrium although total or partial substitution of other elements has been useful. Europium, in particular, yields increased values of $T_c$. Total substitution by lutetium as well as lanthanum has also been employed, as has (substantial) partial substitution by scandium. Partial substitutions, e.g., at the 25 mole percent level, do not substantially affect $T_c$ in many instances. The 2:1 A site occupancy is considered essential to form superconducting perovskite structures with small rare earths (Y, Eu, Lu). Experiments thus far with compositions deviating by as little as 10 percent, result in multiphase material. For larger rare earths, e.g., La, considerable variation in the M/M' ratio is tolerated structurally, although larger variation generally does not lead to optimized superconductive characteristics. It is observed that partial substitution, like total substitution, generally gives rise to some change in the degree and type of distortion from cubic perovskite. Again, it has generally been observed that reduction in distortion corresponds with some lessening in $T_c$.

Barium and yttrium are currently preferred M, M' occupants. Substitution, whether partial or total, is preferably by ions that approach the size of the ions that are replaced. Substitution of the divalent ion in the M site also meets such size criteria.

It is well known that copper-based perovskites can be—generally are—oxygen deficient. Materials of the invention which have been examined are no exception. Measurements made in the usual manner (thermogravimetric analysis using hydrogen reduction at 950° C.) yield values of δ within the range of from 1.5 to 2.5. As described in the co-assigned U.S. patent application, conductivity is largely dependent upon electrons yielded by the coexistence of both divalent and trivalent copper. The observed oxygen stoichiometry yields an average copper valence centering about 2.3. The average valence state is dependent upon processing conditions. Specifically varying the temperature and time of oxygen anneal varies this quantity.

Other preferred materials belong to the class having formula $La_{2-x}M_xCuO_{4-\delta}$, where M is one or more of Ba, Sr, Ca, Pr, Y, and Bi with $0 \leq \delta \leq 0.5$, and $0.05 \leq x \leq 1.2$. These materials generally deviate from cubic symmetry. Substitution of a minor amount of Cu by another element, e.g., Sn, is also contemplated. In general, materials of this class have been described in U.S. patent application Ser. No. 001,682, incorporated herein by reference, and can be prepared in substantially the same manner as materials in the above described class of formula $M_2M'Cu_3O_{9-\delta}$.

Composition and Preparation of Some Preferred Materials

Material specification in accordance with the invention depends upon the nature of the intended use. For power transmission, or other current-carrying application, it is required that there be a continuous superconducting path. For detector and other device use (e.g., Josephson junction devices) in which tunneling might be permitted or even required, it may be necessary only that there be sufficient superconducting phase to satisfy such use.

Appropriate starting materials are mixtures of metallic oxides, hydroxides, carbonates, hydrates, oxalates or other reactive precursors in the appropriate ratio to obtain the desired final composition. Starting material may be produced by wet or dry mixing, by co-precipitation of materials from solution, or by any other method which results in intimate mixture of reactive particles.

Mixtures of starting materials can be fired in air, oxygen or other non-reducing ambient at temperatures sufficient to facilitate chemical reaction between constituents and to begin formation of the desired phase. Firing temperatures as noted are composition-dependent so that choice of temperature may radically affect $T_c$ for certain compositions. Typically, temperatures are between approximately 700 and 950 C. for times of between a few hours and several days until the desired phase is either fully or partially produced. The "calcined" material is then formed into the ceramic body of desired shape by an appropriate ceramic processing technique, as will be described in detail below.

The green body is fired at a temperature sufficiently high to complete chemical reaction of components ("reactive sintering") if not accomplished during calcining, and for densification. This sintering is conducted so as to reduce voids to the point where the density of the ceramic body is sufficient to allow obtaining favorable electrical and mechanical properties. For most favorable results, the material is fired in an ambient environment with greater partial pressure of $O_2$ than that of air (0.2 atm.).

A significant aspect of the invention is the formation of a filamentary or sheet-like ceramic superconductive body. In general, known techniques can be used to form the given body. These include extrusion, screen printing, tape casting, and slip casting.

The starting materials for each of these processes comprise finely divided oxidic powder, solvent, and optionally one or more of binder, plasticizer, deflocculant, and wetting agent. Typically the starting materials for the various processes may differ substantially only in consistency, due primarily to differences in the amount of solvent used. The starting material for extrusion typically is a relatively stiff paste, and that for slip casting being a liquid slurry. Screening and tape casting materials are of intermediate viscosity, with the former being more like a paste and the latter being more like a slurry. Typically the powder is about 25–75% by weight of the preparation.

Some known nonaqueous solvents are acetone, ethyl alcohol, benzene, bromochloromethane, butanol, diacetone, ethanol, isopropanol, methyl isobutyl ketone, toluene, trichloroethylene, and xylene.

Known binders for use in nonaqueous systems comprise cellulose acetate butyrate resin, nitrocellulose, petroleum resins, polyethylene, polyacrylate esters, polymethylmetacrylate, polyvinyl alcohol, polyvinyl butryal resins, and polyvinyl chloride.

Known plasticizers for use in nonaqueous system comprise butyl benzyl phthalate, butyl stearate, dibutyl phthalate, dimethyl phthalate, methyl abietate, mixed phthalate esters, polyethylene glycol, polyalkylene glycol derivatives, and tricresyl phosphate. Among known deflocculants for use in nonaqueous systems are fatty acids (e.g., glyceryl tri-oleate), natural fish oils (e.g., menhaden), and synthetic surfactants (e.g., benzene sulfonic acids).

Known wetting agents for use in nonaqueous systems include alkylaryl polyether alcohols, ethylether of polyethylene glycol, ethyl phenyl glycol, polyoxyethylene acetate, and polyoxyethylene ester.

More detail, including defoamers, binders, plasticizers, deflocculants and wetting agent for use in aqueous systems, can be found in F. F. Y. Wang, editor, *Treatise on Materials Science and Technology*, Vol. 9, *Ceramic Fabrication Processes*, Academic Press (1979), especially p. 179.

After preparation of the paste or slurry, as the case may be, the green body is formed. Among the currently preferred techniques for forming a sheet-like body are screen printing and tape casting.

In the former a (typically patterned) sheet-like green body is formed by the known screen printing technique (see, for instance, J. Medernach, *Hybrid Circuit Technology*, February 1987, p. 21) on a chemically compatible substrate. A substrate is chemically compatible with the superconductive material thereon if, during processing, substantially no chemical superconductivity-destroying interaction occurs between the substrate and the body thereon. For instance, we have found that, at least for (La, Sr) copper oxide-type material, alumina is frequently not a chemically compatible substrate material, whereas zirconium oxide is generally chemically compatible.

Sheet-like bodies formed by screen printing can be, for instance, fine lines used to interconnect electronic components, or conductor patterns that define electrical components such as an inductor. Alternatively such bodies can have comparable extent in two dimension, e.g., to form a superconducting backplane or flux shield. Other possible uses of screen printed bodies include detectors and Josephson junction devices. Ceramic superconductive bodies produced by screen printing typically have thickness between about 5 $\mu$m and about 100 $\mu$m.

The tape casting technique (also known as the doctor blade process) is also well known to those skilled in the art. See, for instance, F. F. Y. Wang, op. cit., pp. 173–197, incorporated herein by reference. The technique is schematically depicted in FIG. 1, wherein 10 is a tempered glass bed, 11 is a carrier film (e.g., polytetrafluoroethylene, (PTFE), barrier 12 and doctor blade 13 define a reservoir for the slurry, and 15 refers to means for adjusting the gap between the doctor blade and the carrier film. A strip of slurry 16 is deposited on the carrier film by translation of the casting head relative to the carrier film, the strip is dried, and the resulting flexible tape (or portion thereof) is fired. Since in general the green tape has to be supported during firing, the support has to be chemically compatible with the superconductive oxide material.

Chemical compatibility between the support and the body supported is also essential for the filamentary bodies typically produced by extrusion, as well as for the bodies produced by slip casting. (For a description of the extrusion process, see, for instance, W. D. Kingery, editor, *Ceramic Fabrication Processes*, MIT and John Wiley & Sons, 1958, pp. 107–111, and for a description of the slip casting process, see, for instance, ibid, pp. 45–51.) Zirconium oxide is expected to be chemically compatible with many, if not all, of the superconductive oxides of interest herein, and is a convenient substrate material. Any given combination of superconductive oxide and substrate material can readily be checked for chemical compatibility, by firing the combination and by checking the resulting ceramic body for superconductivity.

Figure 2:
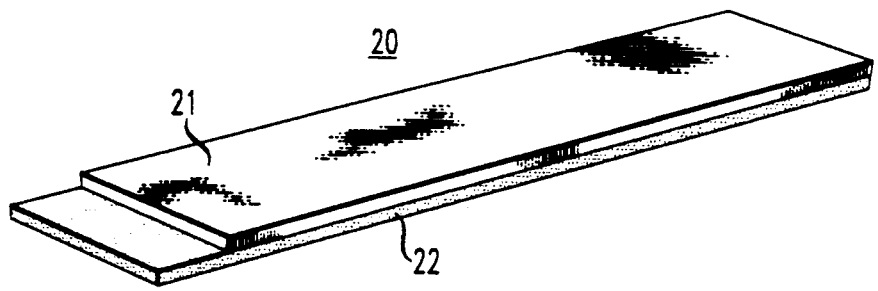
FIG. 2 schematically depicts an inventive body consisting of a superconductive tape and an insulating tape.
Figure 3:
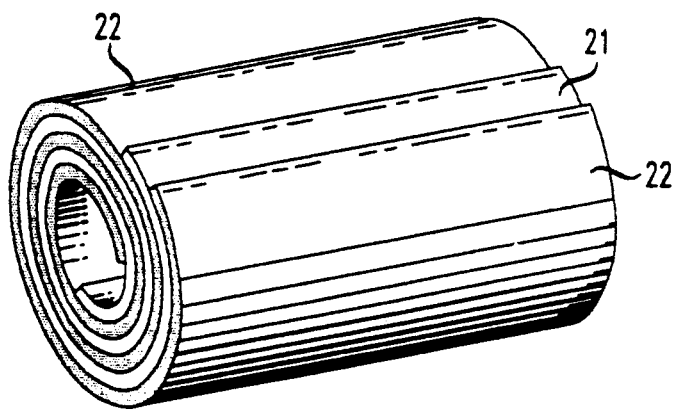
FIG. 3 schematically shows a "jelly-roll" magnet coil produced from inventive material.

As will be appreciated by those skilled in the art, bodies that comprise superconductive ceramics in combination with non-superconductive (typically insulating) ceramics can also be produced. For instance, a laminate 20 consisting of an insulating tape 21 and a superconductive tape 22 is shown in FIG. 2. Such a laminate can be formed by tape casting. If the combination of materials is not chemically compatible, a barrier layer of chemically compatible material may be required between 21 and 22. The laminate can be processed in conventional manner, provided the two tapes have matched sintering parameters and thermal expansion. It may be desirable in some cases to impart a desired shape to the laminate prior to firing. For instance, FIG. 3 schematically shows a "jelly roll" laminated tape magnet coil that may be advantageously fired in this form.

Figure 4:
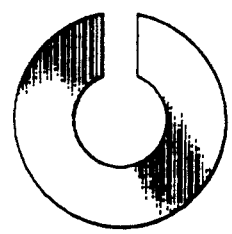
FIG. 4 depicts an inventive body that can be used to assemble a Bitter-type magnet.

A superconducting magnet of the "Bitter" type can be assembled from alternating slotted tori (shown schematically in FIG. 4) formed from superconductive tape and appropriate insulating material, respectively. Eventual electrical continuity between the superconductive tori typically is established prior to firing of the assembly by fusing of the overlapping ends of adjacent tori.

For some purposes (e.g., for power transmission) a thin continuous strip of superconductive material can be advantageously used. Such a strip can be formed by tape casting and can be fired either free standing or wound helically on an appropriate mandrel. Firing can be continuous or in batch fashion. Exemplary prior art transmission lines are described in detail in *Superconductor Applications, SQUIDS and Machines*, op. cit., pp. 672–699. Cables that utilize high $T_c$ superconductive bodies according to the invention are expected to be similar in principle but of significantly simpler construction, since LHe-cooling is not required. Advantageously one or more superconductive strips according to the invention are wound helically on a core element that provides mechanical support for the strips, and may serve as a conduit for $LN_2$. The superconducting strips are surrounded by electrical insulation, thermal insulation, and mechanical protection layers, and optionally with a further refrigerant conduit, in a manner similar to the prior art cables of FIG. 2 of the cited reference.

Figure 10:
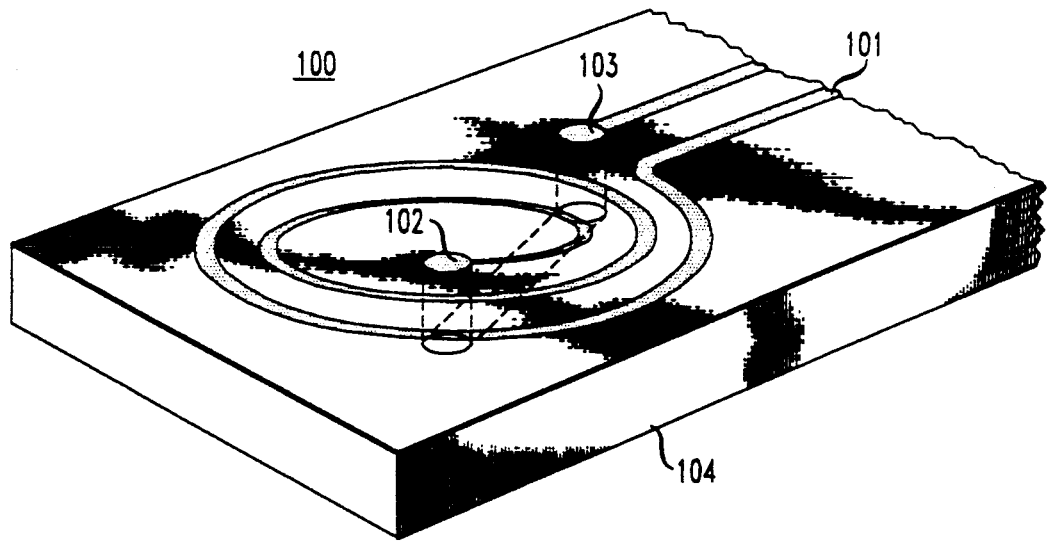
FIG. 10 illustrates a further embodiment of the invention, a high Q inductor coil.

FIG. 10 schematically depicts an embodiment produced advantageously by screen printing, namely, a high Q inductor 100 on an insulating substrate 104. The inductor consists of a superconducting spiral winding 101, with via holes 102 and 103 filled with superconductive material that makes contact with the indicated return path.

EXAMPLE I

A thin sheet of superconductive ceramic of the $Ba_2YCu_3O_{9-\delta}$-type was prepared as follows. 114.385 g of $Y_2O_3$ (98,706% $Y_2O_3$), 394.680 g $BaCO_3$ (essentially 100% $BaCO_3$), and 241.738 g CuO (98.71% CuO) was thoroughly mixed with about 3 l of deionized water and milled for 4 hours in a 4 l polyethylene jar that was approximately half filled with 1 cm diameter, 1 cm length $ZrO_2$ milling media. The resulting slurry was filtered and the filter cake was dried at 130° C. in air. The dried cake was passed through a 20-mesh sieve and the fragments calcined in fused silica boats in air, by raising the temperature linearly with time in 4 hours from room temperature to 900° C. in $O_2$, maintaining the temperature at 900° C. for two hours, and then furnace cooling to room temperature. The calcined powder was mixed with deionized water milled for 4 hours, filtered, dried, and passed through a 20-mesh sieve, all substantially as described above. 200 g of the resulting powder was mixed with 200 g of an acrylic binder dissolved in 1, 1, 1 trichloroethane solvent (Cladan No. 73140 obtained from Cladan, Inc., San Marcos, Calif.) in a 1 l polyethylene jar half filled with the above $ZrO_2$ milling media, and milled on a roller mill for 16 hours, followed by very slow rolling for 1 hour to remove entrained air.

The thus produced slurry was poured into the reservoir of a doctor blade tape caster, with a gap 7.6 cm wide and 0.71 mm high. The slurry was cast in conventional fashion onto a PTFE-coated plate by moving the casting head across 1.8 m of the plate at 1.8 cm/sec. The resulting strip of slurry was dried for 16 hours in air, yielding a flexible tape 112 $\mu$m thick and about 7.6 cm wide. A portion of the flexible tape was placed on a $ZrO_2$ substrate, covered with low density $Al_2O_3$ sheet that was coated with $ZrO_2$, and placed in a conventional muffle furnace. The tape was heated to 400° C. in 12 hours and held at that temperature for 12 hours in $O_2$. This resulted in substantial complete removal of the organic binder from the tape. The tape was then sintered by raising the temperature to 900° C. in 4 hours, raising to 950° C. in 5 hours, holding at 950° C. for 5 hours, cooling to 600° C. in 2 hours, and cooling with the furnace to room temperature. The sintering treatment was carried out in 1 atmosphere of flowing oxygen. The resulting tape was approximately 0.1 mm thick, and had substantial flexibility and mechanical strength.

Figure 5:
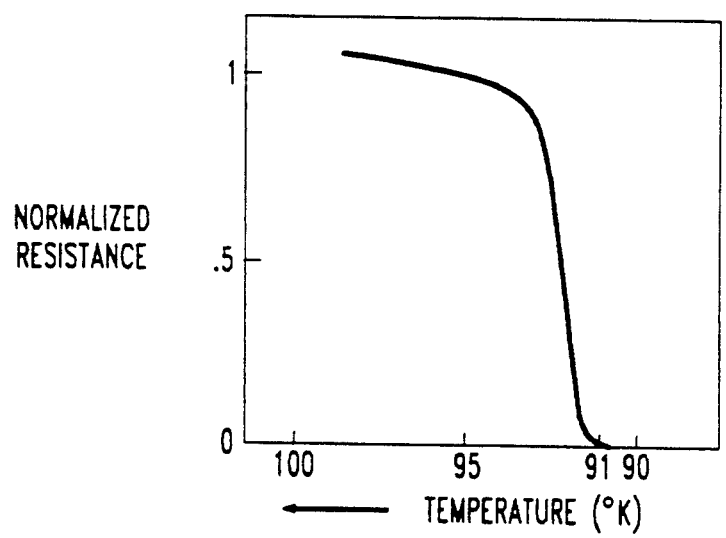
FIGS. 5 and 6 show the resistance and magnetization, respectively, of a sample of inventive ceramic tape as a function of temperature.
Figure 6:
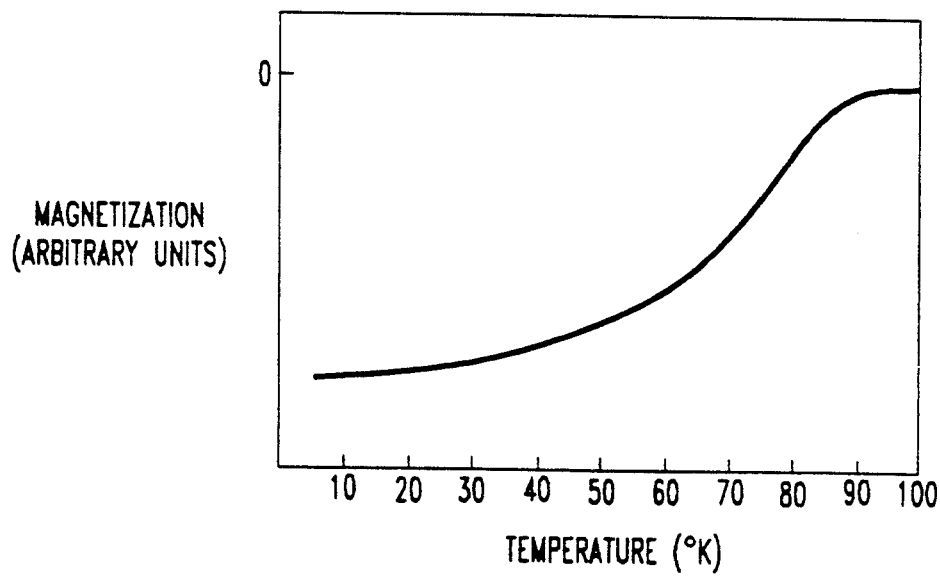
Figure 7:
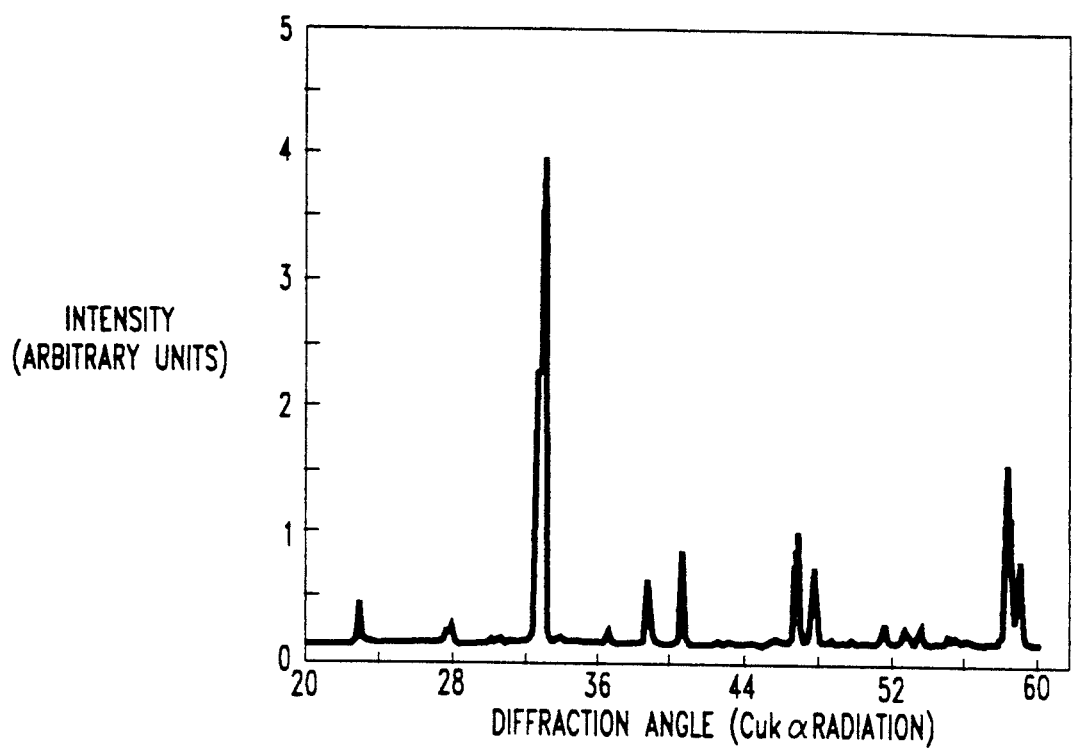
FIGS. 7 and 8 show X-ray diffraction patterns for the ceramic tape, and for powder produced from the tape, respectively.
Figure 8:
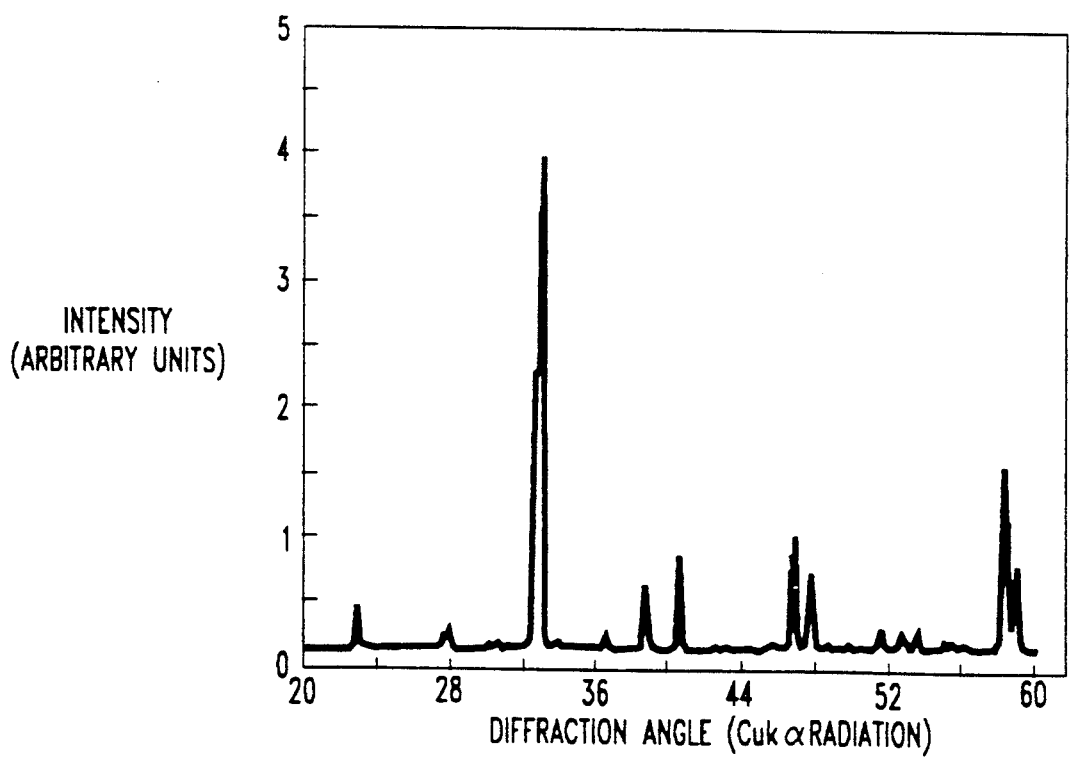
Figure 9:
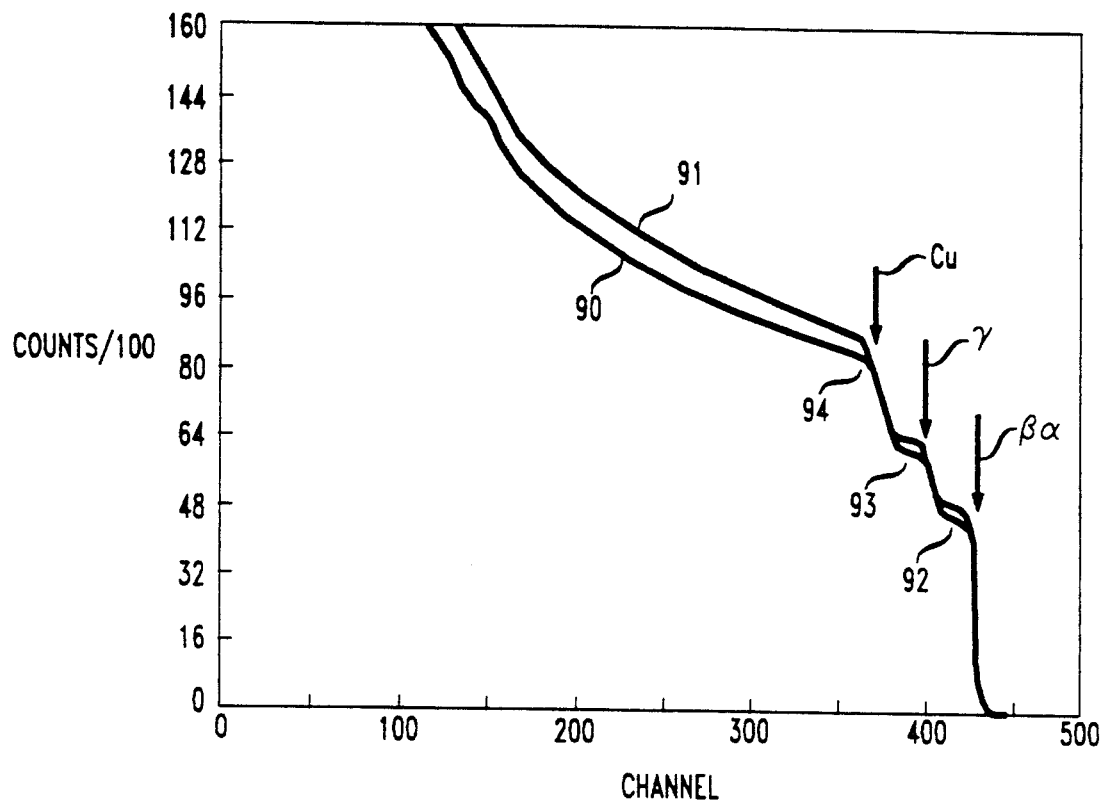
FIG. 9 gives Rutherford Backscattering Spectroscopy (RBS) data for a sample of the inventive tape, and for a polished pellet of essentially the same composition.

A variety of measurements were carried out on the tape. FIG. 5 shows the normalized resistivity of the tape as a function of temperature, indicating that the midpoint of the transition is 92 K., with the resistance vanishing at 91 K. FIG. 6 shows the magnetization of the tape (in arbitrary units) as a function of temperature, for an applied field normal to the plane of the tape. The sample was cooled in zero field and heated in an applied field of 380 ampere turn/m (4.7 Oe). The Figure clearly shows the existence of superconductivity below 91 K. FIG. 7 shows X-ray diffraction data obtained from the tape, and FIG. 8 shows similar data obtained from a powder sample of the tape material. The two sets of data are essentially identical, indicating the compositional uniformity of the tape material. Analysis of the data shows that the material is the known superconductive phase of the $Ba_2YCu_3O_{9-\delta}$-system, with $\delta$ being about 2. FIG. 9 shows RBS data obtained from the sintered tape (curve 91) and from a polished pellet of essentially the same composition (curve 92) produced as described in the previously referred to co-assigned U.S. application. As is well known, RBS probes only the top layer (about 0.1 µm) of a sample. FIG. 9 shows that the surface layer of the tape is of essentially the same composition as the polished surface of the pellet. In particular, the closely similar heights of knees 92, 93, and 94 indicate that both samples have essentially the same concentrations of Ba, Y, and Cu, respectively. Since the polished surface material was interior material during fabrication of the pellet, the identity of the two RBS spectra proves that even the top 0.1 µm of the tape consist of the known superconducting phase. The data also shows that, to within the resolution of the method, no contaminants have been introduced during the manufacture of the tape.

EXAMPLE II

A ceramic tape is produced substantially as described in Example I, except that 100 g of calcined powder is mixed 15 g of 90-10 vinyl chloride-vinyl acetate copolymer binder, 85 g of methyl ethyl ketone solvent, and 1 g of butyl benzyl phthalate plasticizer. The results obtained is essentially as described in Example I.

EXAMPLE III

A further ceramic tape (about 50 µm thickness, composition $La_{1.8}Sr_{0.2}CuO_{4-\delta}$, with $\delta$ about 0.1) was produced substantially as described in Example I, except as noted: 436.106 g hydrated lanthanum carbonate (67.24% by weight $La_2O_3$ equivalent), 29.736 g strontium carbonate (99.3% b.w. $SrCO_3$), and 80.579 g of copper oxide (98.71% b.w. CuO) were mixed with isopropanol. 80 of the calcined powder was mixed with 80 g of the binder. The tape was heated, after binder burnout, from 400° C. to 1100° C. in 1.75 hours, and held at 1100° C. for 2 hours, cooled over 6 hours to 900° C. followed by cooling to room temperature in 2.15 hours. A portion of the tape was fired between two Pt sheets. This portion was non-superconducting. A further portion was fired while on a Pt substrate without being covered. A segment of this tape which lifted off the substrate during firing was superconductive ($T_c$ about 33 K.), whereas the segment that remained in contact with the Pt substrate was not superconducting.

EXAMPLE IV

Four pieces of green tape, produced as described in Example III, were laminated together by pressing at about 1000 psi and 80° C., then sintered, as described in Example III, on a sheet of Pt. This laminate was superconducting, with $T_c$ of about 28.5 K.

EXAMPLE V

A filamentary body is produced by extrusion as follows. The paste is prepared substantially as in Example I, except that 100 g of the calcined powder is mixed with 50 g of binder made by dissolving 20 g of polyvinyl butyral in 80 g of anhydrous ethyl alcohol. This paste is extruded in a conventional manner at 25 kpsi through a 0.5 mm die. The resulting filamentary green body is dried, would helically onto a loose cylindrical mass of fibrous zirconia, and fired substantially as described in Example I. The resulting helical filament is superconducting. The filament is then slipped over a tubular core, thereby producing a superconducting solenoid.

EXAMPLE VI

A screen printing ink (paste) is produced as follows. The paste is prepared substantially as in Example I, except that 65 g of the calcined powder is mixed with 15 g of ethylene cellulose binder and 10 g of terpineol solvent on a 3-roll shear mixer while further terpineol is added to yield a paste of approximately room temperature viscosity of $3 \times 10^5$ poise. This paste is screen printed in the conventional manner onto an unfired ceramic substrate to yield conductor lines and filled vias such as are shown in FIG. 10. After firing as described in Example I the sheet-like body is superconductive, forming a high Q planar inductor.

What is claimed is:

1. Method of making an article comprising a superconductive body having one or two dimensions in the range from about 5 µm to about 1 mm, wherein the method comprises
   a) providing a powder of nominal composition $Ba_2M'Cu_3O_x$ that is superconducting or that can be transformed into a superconducting powder by a heat treatment in an oxygen-containing atmosphere, where M' is one or more elements selected from the group consisting of Y, La, Eu, Lu and Sc, with the divergence from the nominal formula amounts of Ba and M' being a maximum of 10%;
   b) mixing the $Ba_2M'Cu_3$-oxide powder with an organic polymeric binder material;
   c) forming a "green" ceramic body of a shape selected to yield, after firing, said body having one or two dimensions in the range from about 5 µm to about 1 mm, and comprising said oxide powder mixed with the binder;
   d) firing the green ceramic body such that essentially all of the binder material is removed and including sintering and cooling such that substantially all of the $Ba_2M'Cu_3$-oxide in the body is of nominal composition $Ba_2M'Cu_3O_{9-\delta}$, with $\delta$ being about 2, said firing comprising contacting the body with an atmosphere with $O_2$ partial pressure greater than 0.2 atmospheres.

2. Method of claim 1, wherein the oxide powder has nominal composition $YBa_2Cu_3O_{9-\delta}$, wherein the green body is fired at about 400° C. in $O_2$ until substantially all of the binder material is removed, and wherein the method further comprises maintaining the body at about 950° C. and slow cooling to room temperature, all in oxygen.

3. Method of claim 1, wherein the superconductive body is essentially single phase material.

4. Method of claim 1, wherein the green body is supported during firing by a substrate.

5. Method of claim 4, wherein the green body is formed by screen printing onto a substrate.

6. Method of claim 4, wherein the substrate is shaped so as to minimize the contact area between the substrate and the green body.

7. Method of claim 1, carried out such that the superconductive body has zero electrical resistance at 77 K. or above.

8. Method of claim 1, wherein the green body is formed by a process that comprises extrusion, doctor blade casting, tape casting or slip casting.

* * * * *